United States Patent
Teschner et al.

[11] Patent Number: 5,968,328
[45] Date of Patent: Oct. 19, 1999

[54] DEVICE FOR SPUTTER DEPOSITION OF THIN LAYERS ON FLAT SUBSTRATES

[75] Inventors: Götz Teschner, Hanau; Joachim Szczyrbowski, Goldbach; Karl-Heinz Grosse, Gründau, all of Germany

[73] Assignee: Leybold Systems GmbH, Hanau, Germany

[21] Appl. No.: 08/988,811

[22] Filed: Dec. 11, 1997

[30] Foreign Application Priority Data

Dec. 11, 1996 [DE] Germany .......................... 196 51 378

[51] Int. Cl.⁶ .................................................. C23C 14/34
[52] U.S. Cl. .............................. 204/298.25; 204/298.26; 204/298.08; 204/298.19; 204/298.21; 204/192.12
[58] Field of Search .................... 204/298.25, 298.26, 204/298.08, 298.19, 298.21, 192.12

[56] References Cited

U.S. PATENT DOCUMENTS

| | | | |
|---|---|---|---|
| 5,082,546 | 1/1992 | Szczyrbowski et al. | 204/298.08 |
| 5,169,509 | 12/1992 | Latz et al. | 204/298.19 |
| 5,338,422 | 8/1994 | Belkind et al. | 204/298.19 |
| 5,340,454 | 8/1994 | Schaefer et al. | 204/298.25 |
| 5,399,252 | 8/1995 | Scherer et al. | 204/298.19 |
| 5,415,757 | 5/1995 | Szczyrbowski et al. | 204/298.19 |
| 5,645,699 | 7/1997 | Sieck | 204/298.26 |
| 5,718,815 | 2/1998 | Szczyrbowski et al. | 204/298.08 |
| 5,814,198 | 9/1998 | Lehan et al. | 204/298.08 |

FOREIGN PATENT DOCUMENTS

| | | |
|---|---|---|
| 0070899 | 7/1987 | European Pat. Off. . |
| 2707144 | 8/1977 | Germany . |

*Primary Examiner*—Nam Nguyen
*Assistant Examiner*—Brinda Raghuveer
*Attorney, Agent, or Firm*—Fulbright & Jaworski, LLP

[57] ABSTRACT

In an apparatus for the sputter deposition of thin electrically insulating layers on substrates (33, 33', . . . ) there is provided in an evacuable chamber which is connected to a treatment gas source, a first pair of tubular magnetron cathodes (5, 5' or 31) and at least one additional pair of magnetron cathodes (6, 6' or 25, 26 or 30, 32), a medium frequency generator (10) connected in series with a transformer (9), where the two secondary winding outputs (11, 12) of said transformer are each connected with the cathodes of a second pair (6, 6' or 25, 26 or 30, 32) and where direct current can be fed into the supply lines for the first cathode pair (31) via a center tap (15) of the transformer (9) and a network (17 or 13, 14).

6 Claims, 5 Drawing Sheets

DEVICE FOR SPUTTER DEPOSITION OF THIN LAYERS ON FLAT SUBSTRATES

FIELD OF THE INVENTION

The invention relates to a device for sputter deposition of thin layers of electrically insulating material on flat substrates with a pair of magnetron tubular cathodes arranged in an evacuable chamber.

DESCRIPTION OF THE PRIOR ART

A device of the type being discussed is known (EP0,070, 899), wherein a cathode is arranged horizontally in a coating chamber, the cathode having an elongated cylindrical tube element with the coating material to be sputtered having been deposited on the outer surface of the cathode, and with magnetic means which are arranged in this tubular element in order to define a sputtering zone extending lengthwise therefrom, and with rotating means for said tubular element to permit its axial rotation, where the hollow body is formed from the material to be sputtered at least on the outer side of its side wall, with a magnet circuit for magnetic inclusion which is provided near a target and with a device for a connection to a cooling circuit for the circulation of a cooling liquid in the hollow body, with a device for a connection to an electrical supply circuit, and with a drive for the rotation of the hollow body about its axis, where the magnet circuit extends peripherally in relation to the hollow body, the magnetizing means is provided externally in relation to said hollow body and the poles of the magnet circuit are provided along two generating of said hollow body.

Further, a cathode sputtering device is known (D-OS 2,707,144) with a cathode having a surface to be sputtered, a magnet device for generating magnetic fields arranged near the cathode and on the side opposite that of the surface to be sputtered, of which magnetic fields at least some penetrate the surface to be vaporized and exit from same again at intersecting points at a distance from each other, and between which the field lines form continuous arc-shaped segments at a distance from the surface to be vaporized, whereby the latter form together with the field lines an enclosed area which creates a tunnel-shaped area located above a path thereby defined on the surface to be sputtered, and where charged particles show a tendency to stay back in the tunnel-shaped area and to move along it, as well as with an anode in the vicinity of the cathode and with an electrical potential connection for the anode and the cathode, where at least the surface to be sputtered is arranged within an evacuable container, where a transport means is provided to effect a relative motion between the magnetic field and the surface to be sputtered while maintaining their spacial closeness and where the abovementioned path crosses the surface to be sputtered in an area of the surface which is greater than the surface area overlapped by a stationary path.

In this cylindrical cathode sputtering device, the magnet device, arranged on a cylindrical carrier, can be rotated as well as moved up and down so that it can effect sputtering over the entire surface and it is also possible to select specific areas.

Finally, a device is known (DE 4,106,770) for the reactive coating of a substrate with electrically insulating material, for example silicon dioxide ($SiO_2$), comprising an alternating current source which is connected, in an evacuable coating chamber, with a magnetron cathodes whose targets are sputtered, where two ungrounded outputs of the alternating current source are each connected with a magnetron cathode, where both magnetron cathodes are provided, arranged next to each other, in a coating chamber and are at an approximately equal distance from the substrate arranged opposite to them, where the magnetron cathodes each have a separate distribution line for the processing gas, and where the distribution of the reactive flow to the two distribution lines is controlled by a controller and a conductance regulating valve in such a manner that the measured voltage differential of the effective value of both cathodes corresponds to a nominal voltage—for which the effective value is measured over a cathode supply line and fed to the regulator valve via a line as direct current.

If a DC magnetron, equipped with a metallic target, is operated continuously in an inline apparatus in a reactive gas atmosphere, non-conductive compounds, for example, oxides or nitrites, will form on all substrates and all surfaces of the vacuum chamber. The undesired coating of the chamber components and walls results in a non-conductive coating of electrically conductive surfaces so that the flow of current is disrupted and finally interrupted. This "disappearing anode" effect is a restriction of all DC sputter devices that operate continuously.

SUMMARY OF THE INVENTION

Therefore the object of the present invention is to design a continuous operation sputtering device, in particular for the coating of large surface substrates with a non-conductive coating by means of a rotating coating cathode, in such a manner that said sputter device can even be operated in a continuous, i.e, permanent process.

The object is achieved according to the present invention by connecting additional cathodes or cathode pairs before and/or after a tubular rotating coating cathode or cathode pair powered by direct current, where said additional cathodes or cathode pairs are connected to a medium frequency source and generate a plasma band which extends over the entire cathode configuration, even when the cathodes are arranged in several adjoining chambers with openings provided in the parting walls.

The invention permits a variety of embodiments; some of these are schematically shown in more detail in the appended drawings.

DETAILED DESCRIPTION

Figure 1:
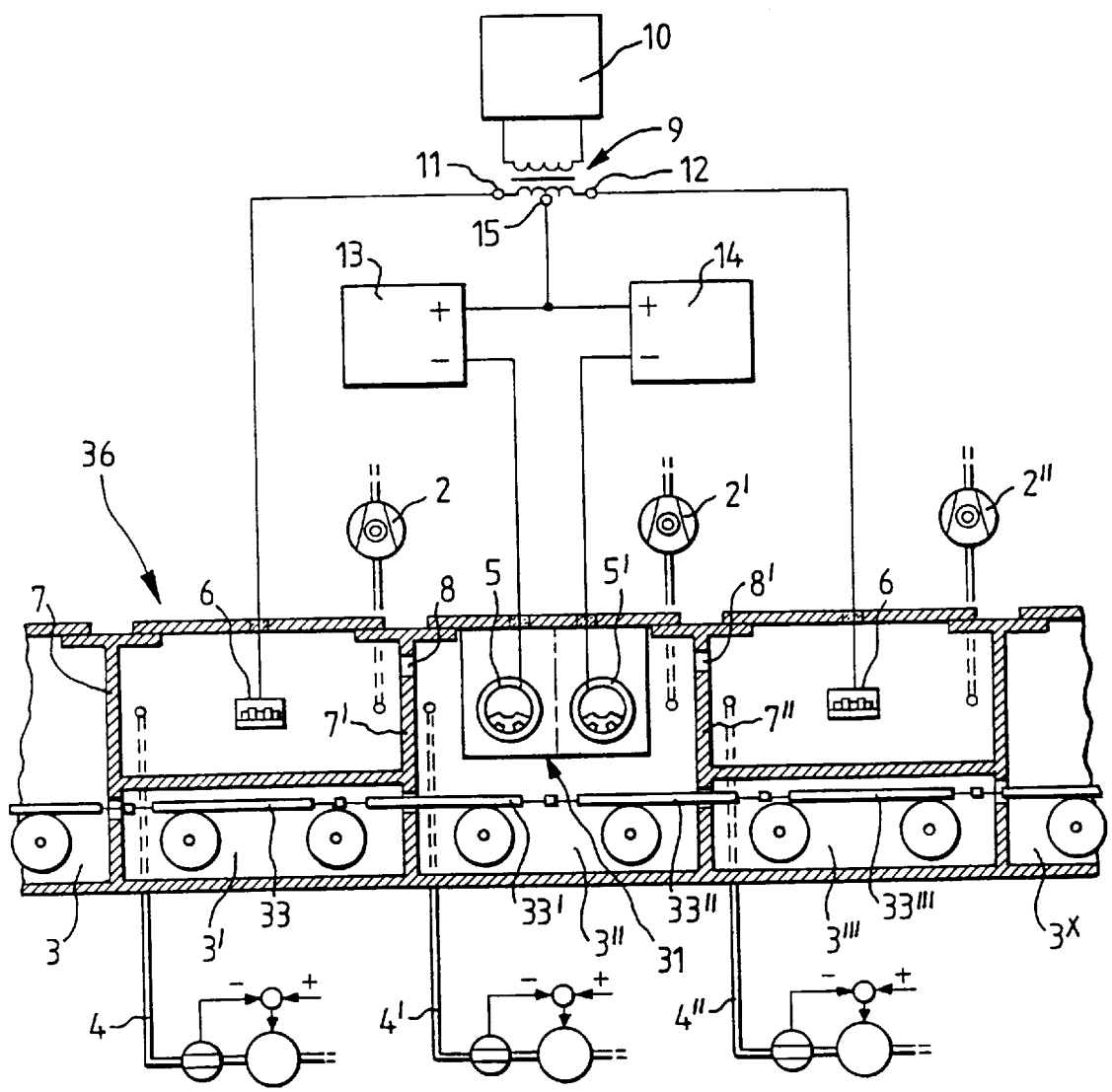
FIG. 1 shows a partial longitudinal section of a continuous operation apparatus for the coating of flat substrates, with three treatment chambers, of which the middle chamber comprises two tubular DC cathodes, and the chambers attached before and after said chamber comprise planar AC magnetron cathodes.

The continuous operation installation 36 for the coating of substrates 33, 33', . . . according to FIG. 1 comprises a plurality of sequentially connected chambers 3, 3', 3", 3''', . . . , of which the three chambers 3', 3", 3''' are designed as coating chambers and are each connected to a treatment gas supply line 4, 4', 4", and are each connected to a vacuum pump 5, 5', 5". The middle chamber of the three chambers 3, 3", 3''', is equipped with two rotatable tubular cathodes 5, 5' ( a tubular cathode pair 31) and the treatment chambers 3', 3''', each arranged either before or after said middle chamber, are each equipped with a planar magnetron cathode 6 or 6'. The parting walls 7', 7", . . . between the individual treatment chambers 3', 3", 3''' are provided with apertures or openings 8, 8' so that a plasma band extending through the treatment chambers 3', 3", 3''' is formed. The planar magnetron cathodes 6, 6' are each provided with a tap 11 or 12 from a transformer 9 of a medium frequency generator 10, while the rotatable tubular cathodes 5, 5' are each connected to an individual direct current supply 13, 14, where both direct current sources 13, 14 are connected by their respective positive terminals to the center tap 15 of the transformer 9.

Figure 2:
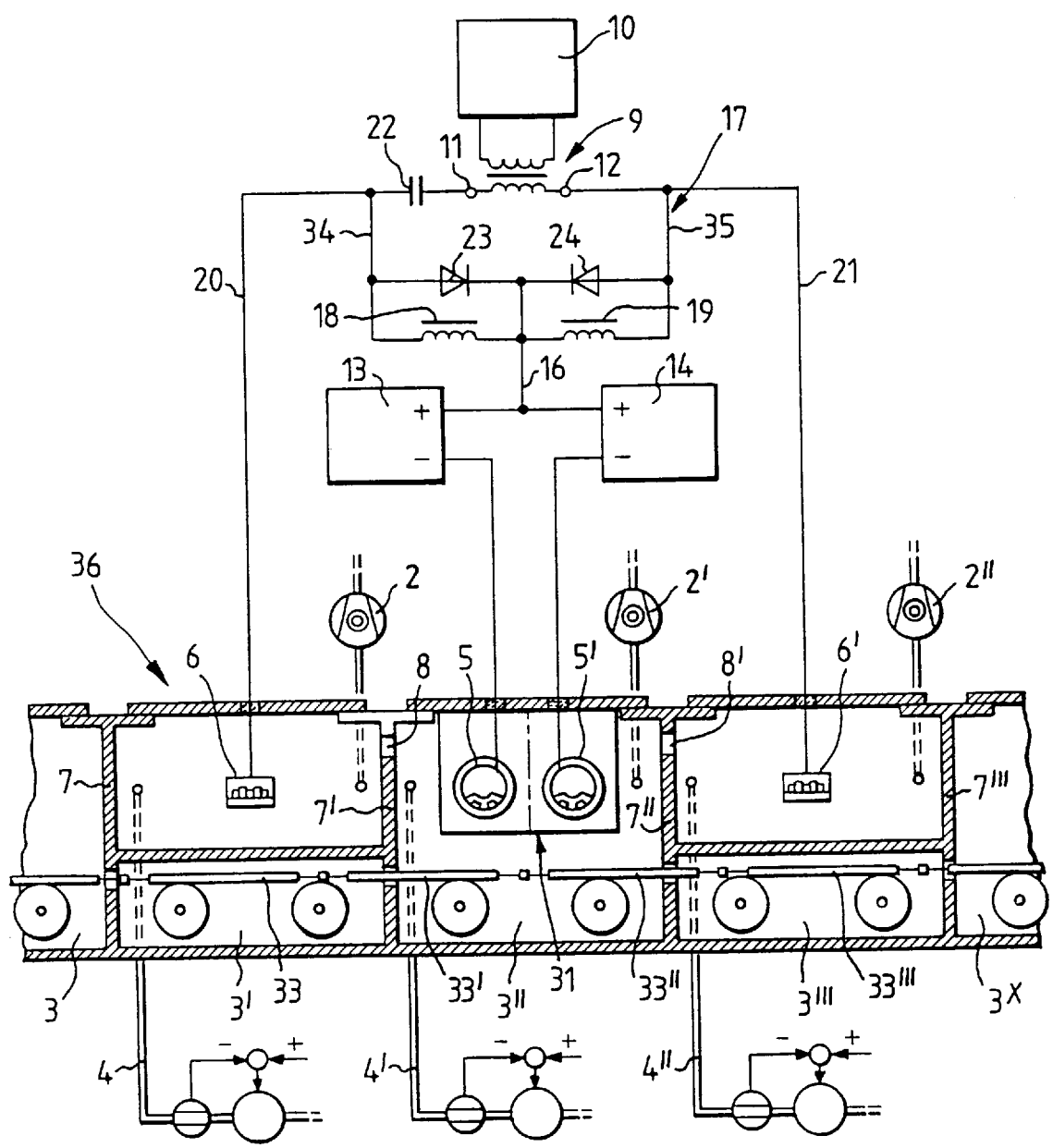
FIG. 2 shows the apparatus according to FIG. 1, but with a blocking capacitor in an electrical supply branch line and a choke for the blocking of the DC power path to the DC power sources.

The apparatus according to FIG. 2 differs from that according to FIG. 1 with respect to the design of the power supply for the individual cathodes 6, 6' or 5, 5'. Here, the taps 11 or 12 of the transformer 9 are connected to the direct current sources 13, 14, for which they are coupled to the two lines 20, 21 feeding the planar magnetrons 6, 6', by a common line 16 and a network 17, with chokes 18, 19 for blocking the direct current path to the direct current power supplies 13, 14, and the diodes 23, 24, where in the one line 20 there is additionally connected a blocking capacitor 22 before the branch to the network 17, which diode causes the separation of the direct current from the transformer 9.

Figure 3:
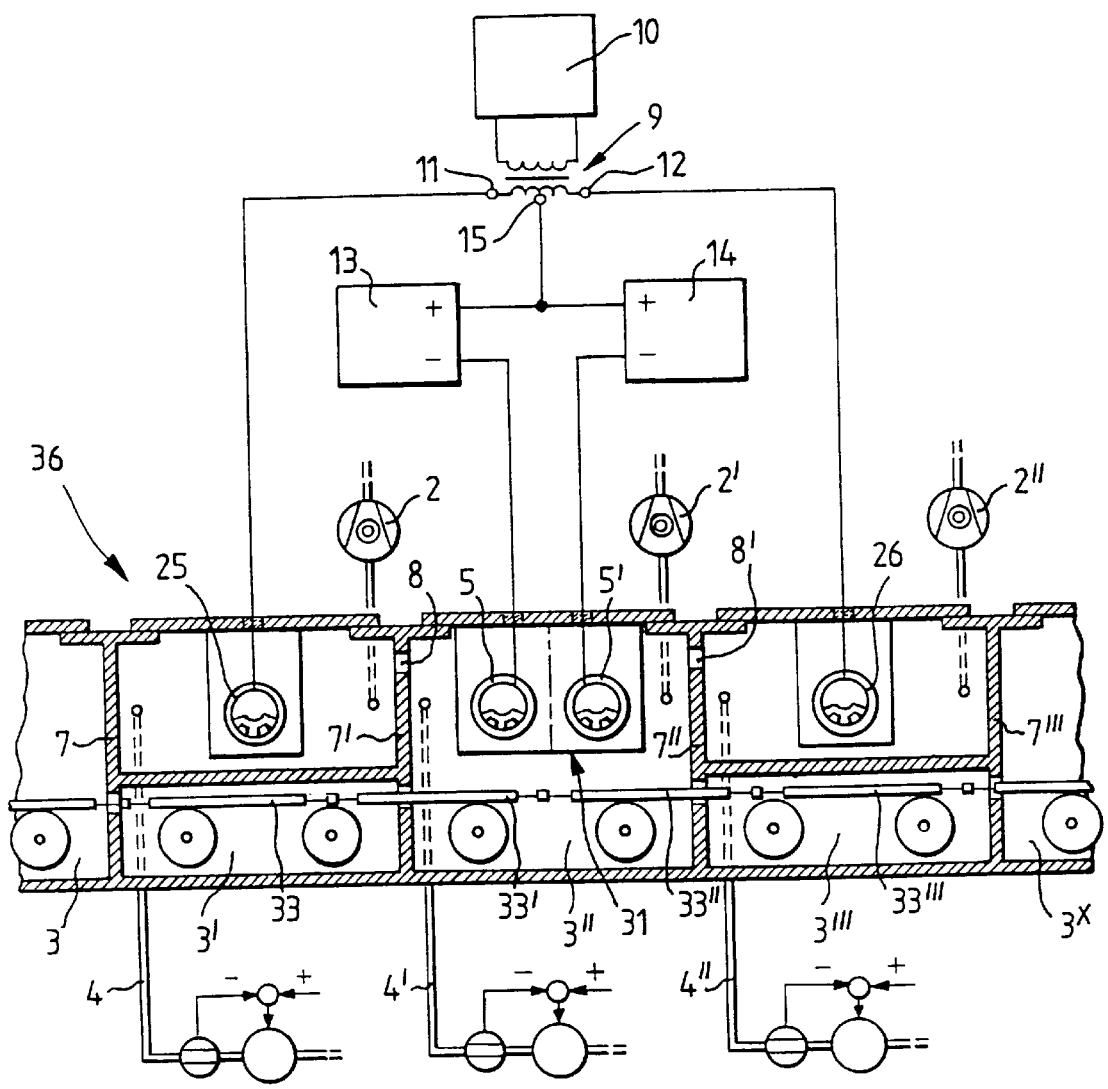
FIG. 3 shows an apparatus similar to that according to FIG. 1, but operated exclusively with tubular cathodes.

The apparatus according to FIG. 3 differs from that according to FIG. 1 in that instead of planar magnetron cathodes 6, 6' there are provided individual rotatable tubular cathodes 25, 26 which are connected to the taps 11, 12 of the transformer 9.

Figure 4:
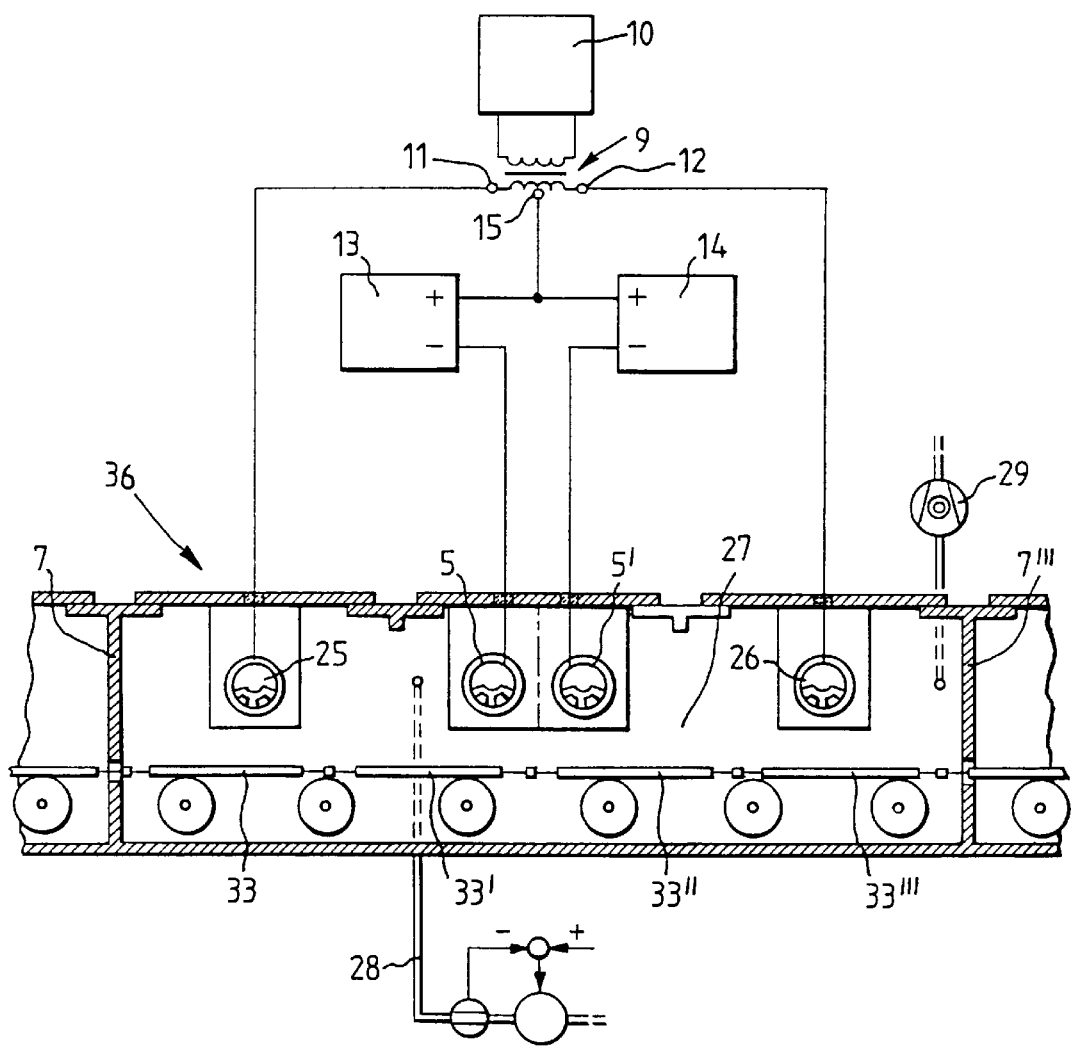
FIG. 4 shows an apparatus similar to that according to FIG. 3, but with a single treatment chamber instead of three.

The apparatus according to FIG. 4 is largely identical to that according to FIG. 3 but with the difference that all rotatable cathodes 5, 5' or 25, 26 are arranged together in one large treatment chamber and there is provided for said chamber one single gas supply line 28 and a vacuum pump 29.

Figure 5:
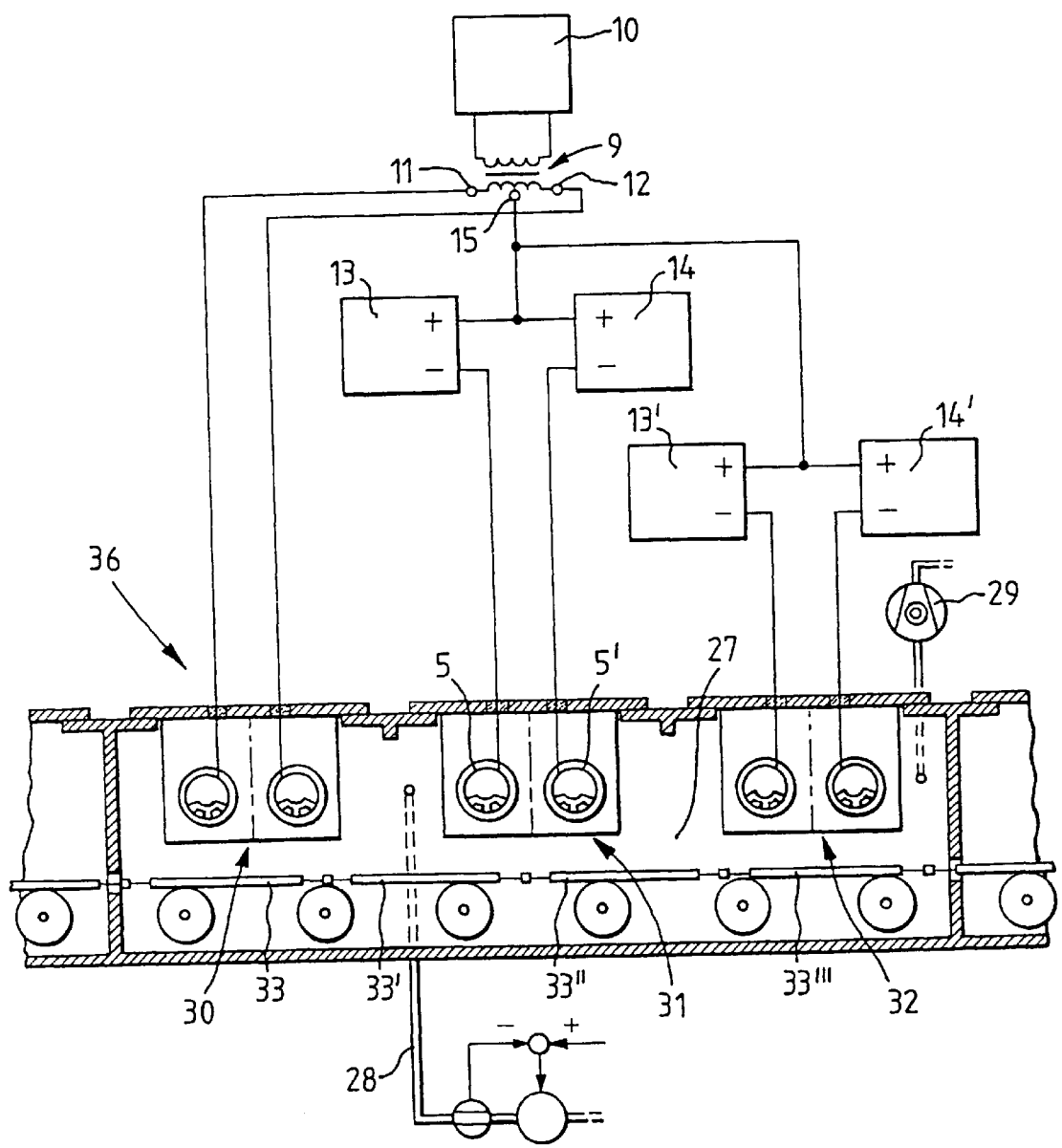
FIG. 5 shows an apparatus comparable to that according to FIG. 4, but with three pairs of tubular cathodes, of which two pairs are supplied with direct current and one pair with alternating current.

The apparatus according to FIG. 5 is again similar to that according to FIG. 4, but with the difference that in the large treatment chamber 27 there are arranged altogether 3 pairs 30, 31, 32 of rotatable tubular cathodes 5, 5', . . . , but of which only one cathode pair 30 is connected to the taps 11, 12 of the transformer 9, while the two other cathode pairs 31, 32, and/or their individual tubular cathodes 5, 5', . . . are each connected to their own direct current sources 13, 14 and or 13', 14'.

The magnetrons shown in the figures can be installed in the same compartment or chamber 27 of the vessel 36 as coating cathodes 5, 5', or else in separate chambers 3, 3''' of the vessel 36. It is important that a continuous slit or opening 8, 8', . . . remains free between the two magnetrons 6, 6' and/or 25, 26. It is not important here whether the slit or opening 8, 8' is straight or bent one or more times. These two magnetrons 6, 6' and or 25, 26 generate, when fed a middle frequency, an intense plasma band which extends through the treatment chamber. This plasma band is used as a virtual anode for the direct current discharge, by either providing the medium frequency transformer 9 with a center tap 15 for the direct current supply, or by using another known method for feeding direct current into an alternating current circuit, as for example in FIG. 2, where the direct current is fed, via the chokes 18, 19 and the recovery diode 18, 19, into the lines 34, 35 supplying the magnetrons 6, 6'. This circuit is technically simple and therefore especially inexpensive.

The tubular direct current magnetrons 5, 5' carry the targets which are to produce the desired coating, while the magnetrons 6, 6' or 25, 26 or 31, 32 which generate the plasma band, are equipped with targets that have as low a sputter rate as possible, for example titanium or graphite. Further, only enough medium frequency power needs to be fed into the discharge as is needed to keep the target surfaces metallically conductive.

Instead of the tubular magnetrons, a planar magnetron 6, 6' or a conventional diode cathode can be substituted. The direct power power supply is not grounded to the chamber or does not work against an additional anode either but is directly incorporated into the medium frequency circuit.

References 3, 3', . . . Chamber
4, 4', . . . Gas supply line
5, 5', . . . Vacuum pump
6, 6', . . . Planar magnetron cathode
7, 7', . . . Parting wall
8, 8', . . . Aperture, opening
9 Transformer
10 Medium frequency source
11 Tap
12 Tap
13, 13' Direct current supply
14' Direct current supply
15 Center tap
16 Electrical line
17 Network
18 Choke
19 Choke
20 Electrical line
21 Electrical line
22 Capacitor
23 Diode
24 Diode
25 Tubular cathode
26 Tubular cathode
27 Treatment chamber
28 Gas supply line
29 Vacuum pump
30 Cathode pair
31 Cathode pair
32 Cathode pair
33 Substrate
34 Branch line
35 Branch line
36 Continuous treatment apparatus, continuous treatment vessel

What is claimed is:

1. An apparatus for sputter deposition of thin layers of electrically insulating material on substrates, said apparatus comprising:

a first pair of tubular magnetron cathodes arranged in an evacuable chamber connected to a gas source;

a second pair of magnetron cathodes;

a medium frequency generator connected in series with a transformer, said transformer having a center tap and secondary winding outputs, each of said secondary winding outputs being connected to a respective cathode of the second pair of magnetron cathodes;

direct current being fed into lines supplying said first pair of tubular mamagnetron cathods through the center tap of the transformer and via a network operatively associated with said first pair of tubular magnetron cathodes.

2. An apparatus for sputter deposition of thin layers of electrically insulating material on flat substrates, said apparatus comprising:

a first pair of tubular magnetron cathodes arranged in an evacuable chamber and connected to a gas source;

additional evacuable chambers connected respectively before and after said chamber;

planar magnetron cathodes each arranged in a respective additional chamber, said chambers having walls separating said chambers, said walls being provided with openings therein;

a medium frequency generator connected in series with a transformer, said transformer having a secondary winding having two outputs, each of said outputs being connected with a respective planar cathode; and said transformer having a center tap connected with two direct current supply lines connected with said first pair of magnetron cathodes.

3. An apparatus for sputter deposition of thin layers of electrically insulating material on flat substrates, said apparatus comprising:

a first pair of tubular magnetron cathodes arranged in a first evacuable chamber which chamber is connected to a gas source;

additional evacuable chambers connected respectively before and after said first chamber;

planar magnetron cathodes each arranged in a respective additional chamber, said chambers having parting walls having apertures therein, said walls separating said chambers, said chambers being arranged next to one another;

a medium frequency generator connected in series with a transformer, said transformer having a secondary winding with two outputs each connected with a respective planar cathode and with direct current sources via branch lines, said lines each supplying electrical power to a respective tubular cathode;

said branch lines including chokes or recovery diodes.

4. An apparatus for sputter deposition of thin layers of electrically insulating material on flat substrates, said apparatus comprising:

a first pair of tubular magnetron cathodes arranged in a first evacuable chamber; and additional evacuable chambers connected respectively before and after said first chamber;

further tubular magnetron cathodes each arranged in a respective additional chamber;

said chambers having separating walls having apertures, said chambers being arranged next to one another, and said walls separating said chambers;

a medium frequency generator connected in series with a transformer, said transformer having a secondary winding with two outputs each connected with a respective one of said further tubular cathodes, and said transformer having a center tap connected with two direct current sources which supply electric power to said first pair of tubular magnetron cathodes.

5. An apparatus for sputter deposition of thin layers of electrically insulating material on flat substrates, said apparatus comprising:

a plurality of tubular magnetron cathodes arranged in an evacuable chamber;

a medium frequency generator to which a transformer is connected in series, said transformer having a center tap and a secondary winding with two outputs, said outputs each connected with a respective tubular magnetron cathode;

said center tap being connected with two direct current sources, said direct current sources each being connected with a respective tubular magnetron cathode, other than the pair of cathodes connected with the secondary winding outputs of said transformer said cathodes being arranged immediately adjacent one another.

6. An apparatus for sputter deposition of thin layers of electrically insulating material on flat substrates, said apparatus comprising:

pairs of tubular magnetron cathodes each arranged in pairs in a chamber, said chamber being connected to a treatment gas source;

a medium frequency generator to which a transformer is connected in series, said transformer having two secondary winding outputs each connected with a respective cathode of one of said pairs of cathodes; and said transformer having a center tap connected via a network to a plurality of direct current sources connected with cathodes of the pairs of cathodes other than the pair of cathodes connected with the secondary winding outputs of the transformer.

* * * * *